(12) United States Patent
Oh et al.

(10) Patent No.: US 9,417,518 B2
(45) Date of Patent: Aug. 16, 2016

(54) PHOTOMASK AND METHOD OF MANUFACTURING THE SAME

(71) Applicant: SAMSUNG ELECTRONICS CO., LTD., Suwon-si, Gyeonggi-do (KR)

(72) Inventors: Jong-Keun Oh, Seoul (KR); Hyung-Ho Ko, Hwaseong-si (KR); Byung-Gook Kim, Seoul (KR); Jae-Hyuck Choi, Seoul (KR); Jun-Youl Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 199 days.

(21) Appl. No.: 14/217,976

(22) Filed: Mar. 18, 2014

(65) Prior Publication Data

US 2015/0010852 A1 Jan. 8, 2015

(30) Foreign Application Priority Data

Jul. 3, 2013 (KR) .................. 10-2013-0077847

(51) Int. Cl.
*G03F 1/48* (2012.01)
*G03F 1/54* (2012.01)
(52) U.S. Cl.
CPC .... *G03F 1/48* (2013.01); *G03F 1/54* (2013.01)

(58) Field of Classification Search
CPC ....................................................... G03F 1/48
See application file for complete search history.

(56) References Cited

U.S. PATENT DOCUMENTS

| 2010/0304276 | A1 | 12/2010 | Jun |
| 2012/0003838 | A1 | 1/2012 | Ookuma et al. |
| 2012/0141923 | A1* | 6/2012 | Deweerd ................. G03F 1/48 430/5 |
| 2012/0148944 | A1 | 6/2012 | Oh et al. |

FOREIGN PATENT DOCUMENTS

| JP | 07-240400 | 9/1995 |
| JP | 08-123008 | 5/1996 |
| JP | 2011-065113 | 3/2011 |
| JP | 2011-070068 | 4/2011 |
| JP | 2013-058785 | 3/2013 |
| KR | 10-2006-0122578 A | 11/2006 |
| KR | 10-2007-0115353 A | 12/2007 |
| KR | 10-2012-0081654 A | 7/2012 |

* cited by examiner

*Primary Examiner* — Stephen Rosasco
(74) *Attorney, Agent, or Firm* — Lee & Morse, P.C.

(57) ABSTRACT

A photomask includes a transparent substrate, a mask pattern formed on the substrate, and a protective layer pattern covering side walls of the mask pattern, wherein a top of the protective layer pattern is exposed.

9 Claims, 6 Drawing Sheets

PHOTOMASK AND METHOD OF MANUFACTURING THE SAME

CROSS-REFERENCE TO RELATED APPLICATION

Korean Patent Application No. 10-2013-0077847, filed on Jul. 3, 2013, in the Korean Intellectual Property Office, and entitled: "Photomask And Method Of Manufacturing The Same," is incorporated by reference herein in its entirety.

BACKGROUND

Embodiments relate to a photomask and a method of manufacturing the same.

SUMMARY

Embodiments are directed to a photomask including a transparent substrate, a mask pattern formed on the substrate, and a protective layer pattern covering side walls of the mask pattern. A top of the protective layer pattern is exposed.

The top of the protective layer pattern and a top of the mask pattern may be positioned on a same plane.

The protective layer pattern may include a first area and a second area. The first area may be closer to the transparent substrate than the second area. A width of the first area may be larger than a width of second area, the width of the first area and the width of the second area being measured in a direction parallel to the transparent substrate and perpendicular to a side surface of the mask pattern.

The mask pattern may include a third area and a fourth area. The first area may be on side walls of the third area and the second area is on side walls of the fourth area. A sum of widths of the first and third areas may be the same as a sum of widths of the second and fourth areas.

The protective layer pattern may include a first surface contacting the mask pattern and a second surface exposed to the outside. The second surface is substantially vertical to the transparent substrate.

The mask pattern may include a first film including a first material and a second film including a second material different from the first material.

The mask pattern may include a plurality of films formed by alternately laminating the first film and the second film.

The first material may include at least one of Mo and Ru. The second material may include Si.

An etching rate of the protective layer pattern to $H_2SO_4$ and/or $NH_4OH$ may be lower than that of the mask pattern.

The mask pattern may include Mo. The protective layer pattern may include at least one of Si, Cr, Ta, Zr, silicon oxide ($SiO_x$), silicon nitride ($SiN_x$), chromium oxide ($CrO_x$), chromium nitride ($CrN_x$), zirconium oxide ($ZrO_x$), tantalum oxide ($TaO_x$), and tantalum nitride ($TaN_x$).

Embodiments are also directed to a method of manufacturing a photomask including forming a mask pattern on a transparent substrate, conformally forming a protective layer on the top of the transparent substrate, the side wall of the mask pattern, and the top of the mask pattern, and forming a protective layer pattern on the side wall of the mask pattern by patterning the protective layer, wherein the top of the protective layer pattern is exposed.

The patterning of the protective layer may include exposing the top of the mask pattern and the top of the transparent substrate.

The patterning of the protective layer may include patterning the protective layer by an anisotropic etching process.

An etching rate of the protective layer pattern to $H_2SO_4$ and/or $NH_4OH$ may be lower than that of the mask pattern.

The forming of the protective layer may include forming the protective layer through an atomic layer deposition (ALD) process.

Embodiments are also directed to a photomask including a transparent substrate, a mask pattern formed on the substrate, the mask pattern including sidewalls, and a protective layer pattern covering the side walls of the mask pattern, a top of the protective layer pattern being exposed, the protective layer pattern being formed by depositing a protective layer on the mask pattern through an atomic layer deposition (ALD) process and patterning the protective layer.

The top of the protective layer pattern and a top of the mask pattern may be on a same plane.

The mask pattern may include Mo. The protective layer pattern may include at least one of Si, Cr, Ta, Zr, silicon oxide ($SiO_x$), silicon nitride ($SiN_x$), chromium oxide ($CrO_x$), chromium nitride ($CrN_x$), zirconium oxide ($ZrO_x$), tantalum oxide ($TaO_x$), and tantalum nitride ($TaN_x$).

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

It is to be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A photomask according to an embodiment will be described with reference to FIG. 1.

Figure 1:
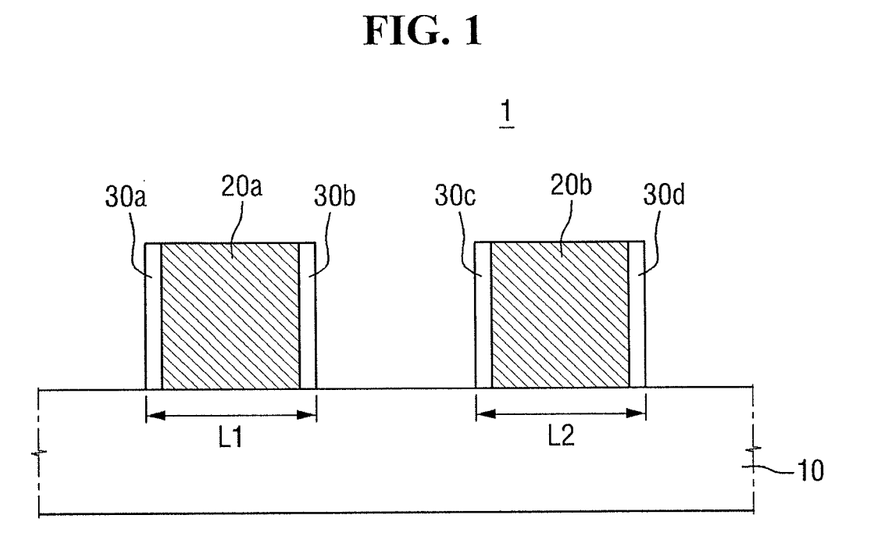
FIG. 1 illustrates a cross-sectional view of a photomask according to an embodiment.

FIG. 1 illustrates a cross-sectional view of a photomask according to an embodiment.

Referring to FIG. 1, a photomask 1 according to this embodiment includes a transparent substrate 10, mask patterns 20a and 20b, and protective layer patterns 30a, 30b, 30c, and 30d.

The transparent substrate 10 may include a material that transmits exposed light and may include, for example, quartz or glass.

The mask patterns 20a and 20b are formed on the transparent substrate 10. Two mask patterns 20a and 2b are illustrated in the figure. In other implementations, when viewed in the cross-sectional view, only one mask pattern may be formed on the transparent substrate 10 or three or more mask patterns may be formed. The tops of the mask patterns 20a and 20b may be exposed.

The mask patterns 20a and 20b may be formed according to a layout of a circuit pattern to which the mask patterns 20a and 20b are to be transferred. The mask patterns 20a and 20b may use a material that does not substantially transmit the exposed light and may include, for example, a metallic material such as Mo, or the like and may additionally include Si, O, or N. A phrase "the mask patterns 20a and 20b do not substantially transmit the exposed light" includes a case in which some exposed light is transmitted in addition to a case in which the exposed light is fully is blocked, as long as the layout of the circuit pattern to be transferred may be formed.

The protective layer patterns 30a, 30b, 30c, and 30d may be formed on both side walls of the mask patterns 20a and 20b. A first protective layer pattern 30a may be formed on one side wall of the first protective layer pattern 20a, a second protective layer pattern 30b may be formed on the other side wall, a third protective layer pattern 30c may be formed on one side wall of the second protective layer pattern 20b, and a fourth protective layer pattern 30d may be formed on the other side wall.

The protective layer patterns 30a, 30b, 30c, and 30d may fully cover both side walls of the mask patterns 20a and 20b. Therefore, both side walls of the mask patterns 20a and 20b are not exposed.

The tops of the first and second protective layer patterns 30a and 30b may be positioned on the same plane as the top of the first mask pattern 20a, and the third and fourth protective layer patterns 30c and 30d may be positioned on the same plane as the second mask pattern 20b. The protective layer patterns 30a, 30b, 30c, and 30d may have the same height as the mask patterns 20a and 20b. The tops of the protective layer patterns 30a, 30b, 30c, and 30d may be exposed.

The protective layer patterns 30a, 30b, 30c, and 30d may serve to prevent a decrease in line width of a light blocking film pattern in a reproduction process of the photomask. The reproduction process of the photomask includes a re-pellicle process of removing a pellicle that protects the photomask and attaching the pellicle again. An adhesive component to attach the pellicle may be removed in order to remove the pellicle. To this end, a strip solution including solutions such as sulfuric acid ($H_2SO_4$), ammonium hydroxide ($NH_4OH$), and the like may be used. If the side walls of the mask patterns 20a and 20b are exposed, the side walls of the mask patterns 20a and 20b could be etched by the strip solution, and as a result, the line width could be decreased and total uniformity of the photomask patterns could be degraded.

In particular, as the degree of integration of a semiconductor device increases, the likelihood that the quality and reliability of the semiconductor device may be degraded increases even when a change in the line width of the photomask pattern is minute. When the protective layer patterns 30a, 30b, 30c, and 30d are formed, the mask patterns 20a and 20b may be protected from being etched.

The protective layer patterns 30a, 30b, 30c, and 30d may be made of a stable material that is not etched by a strip solution including sulfuric acid ($H_2SO_4$), ammonium hydroxide ($NH_4OH$), or the like. An etching rate of the protective layer patterns 30a, 30b, 30c, and 30d to the strip solution should be lower than an etching rate of the mask patterns 20a and 20b to the strip solution in order to protect the mask patterns 20a and 20b. Therefore, the protective layer patterns 30a, 30b, 30c, and 30d may include a material different from a material included in the mask patterns 20a and 20b. The protective layer patterns 30a, 30b, 30c, and 30d may include, for example, at least one of Si, Cr, Ta, Zr, silicon oxide ($SiO_x$), silicon nitride ($SiN_x$), chromium oxide ($CrO_x$), chromium nitride ($CrN_x$), zirconium oxide ($ZrO_x$), tantalum oxide ($TaO_x$), tantalum nitride ($TaN_x$), and the like.

A difference in etching rate between the mask patterns 20a and 20b and the protective layer patterns 30a, 30b, 30c, and 30d may be determined by experimentation. When the materials react with first and second solutions, the thickness of a material that remains with time may be measured. As the first and second solutions used in the experiment, solutions used as the strip solution may be used. In the experiment reported in Table 1, below, the first solution included $H_2SO_4$ and $H_2O_2$ and the second solution included $NH_4OH$, $H_2O_2$, and $H_2O$. The experimental result is described in [Table 1].

TABLE 1

| Material | Thickness (nm) | | | | | |
|---|---|---|---|---|---|---|
| | First solution | | | Second solution | | |
| | 0 min | 30 min | 60 min | 0 min | 30 min | 60 min |
| Mo | 181 | 0 | 0 | 181 | 0 | 0 |
| Si | 80 | 81 | 80 | 80 | 80 | 78 |
| Cr | 87 | 87 | 85 | 87 | 87 | 85 |
| Ta | 138 | 138 | 137 | 138 | 136 | 137 |
| Zr | 128 | 126 | 124 | 125 | 124 | 124 |
| SiOx | 173 | 171 | 170 | 172 | 171 | 171 |
| SiNx | 136 | 133 | 133 | 136 | 134 | 133 |
| CrOx | 81 | 81 | 79 | 79 | 79 | 78 |
| CrNx | 118 | 117 | 115 | 118 | 116 | 116 |
| ZrOx | 42 | 38 | 32 | 42 | 38 | 32 |
| ZrNx | 79 | 0 | 0 | 81 | 79 | 79 |
| TaOx | 70 | 70 | 70 | 70 | 70 | 70 |
| TaNx | 72 | 71 | 70 | 71 | 71 | 71 |

It can be seen that an etching amount of Mo by the first and second solutions is large. However, it can also be seen that other materials were not etched by the first and second solutions or that the etching amounts of other materials were small compared to the etching amount of Mo. It can also be seen that zirconium nitride (ZrNx) was barely etched by the second solution, but was etched by the first solution. Therefore, when the first solution is used as the strip solution in the reproduction process of the photomask, zirconium nitride should not be used as the protective layer patterns 30a, 30b, 30c, and 30d.

A first width L1 of the first mask pattern 20a and the first protective layer pattern 30a and the second protective layer pattern 30b formed on both side walls of the first mask pattern 20a may be varied depending on the layout of the circuit pattern. When the photomask 1 is used, a semiconductor device having a line width (CD) of L1 and L2 may be formed. The first width L1 may be different from or the same as the second width L2 of the third protective layer pattern 30c and the fourth protective layer pattern 30d formed on both side walls of the second mask pattern 20b and the first mask pattern 20a.

A photomask according to another embodiment will be described with reference to FIG. 2. A description of a content duplicated with described above is not repeated, and a difference will be primarily described.

Figure 2:
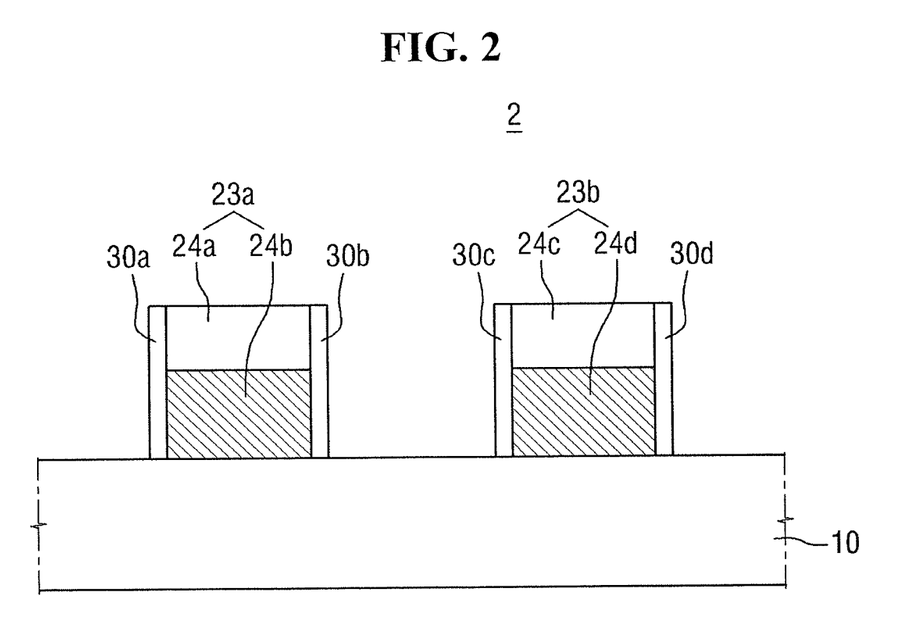
FIG. 2 illustrates a cross-sectional view of a photomask according to another embodiment.

FIG. 2 illustrates a cross-sectional view of a photomask according to this other embodiment.

Referring to FIG. 2, in a photomask 2 according to this embodiment, the mask patterns 23a and 23b may be formed with two layers, unlike the photomask 1 according to the first embodiment. The first mask pattern 23a may include a first anti-reflection film pattern 24a and a first light blocking film pattern 24b, and the second mask pattern 23b may include a second anti-reflection film pattern 24c and a second light blocking film pattern 24d.

The light blocking film patterns 24b and 24d may be formed on the transparent substrate 10. The light blocking film patterns 24b and 24d, and the light blocking film pattern formed of the light blocking film patterns 24b and 24d may include a material that does not substantially transmit the exposed light. For example, the light blocking film pattern 115 may include a metallic material such as chromium (Cr).

The anti-reflection film patterns 24a and 24c may be formed on the light blocking film patterns 24b and 24d. The anti-reflection film patterns 24a and 24c may be formed to absorb reflected light that may be reflected from a wafer during exposure. The anti-reflection film patterns 24a and 24c may include a metal nitride or metal oxide. For example, the anti-reflection film patterns 24a and 24c may include at least one of chromium oxide, chromium nitride, molybdenum (Mo), molybdenum oxide, molybdenum nitride, and molybdenum oxynitride. The anti-reflection film patterns 24a and 24c and the light blocking film patterns 24b and 24d may include different materials.

The protective layer patterns 30a, 30b, 30c, and 30d may be formed to cover both side walls of the anti-reflection film patterns 24a and 24c and the light blocking film patterns 24b and 24d. The tops of the protective layer patterns 30a, 30b, 30c, and 30d may be exposed, and both side walls of the anti-reflection film patterns 24a and 24c and the light blocking film patterns 24b and 24d may not be exposed by the protective layer patterns 30a, 30b, 30c, and 30d.

A photomask according to another embodiment will be described with reference to FIG. 3. A description of a content duplicated with the content described above is not repeated, and a difference will be primarily described.

Figure 3:
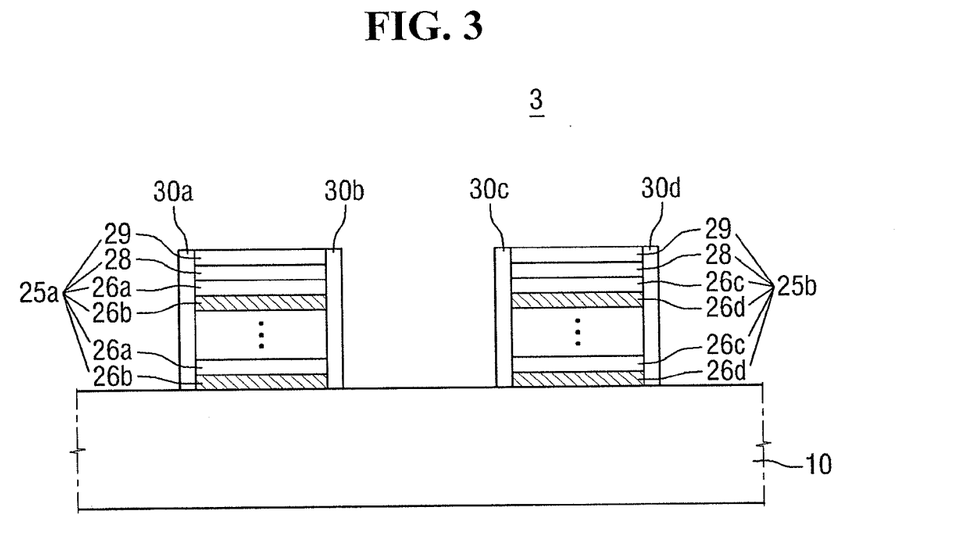
FIG. 3 illustrates a cross-sectional view of a photomask according to another embodiment.

FIG. 3 illustrates a cross-sectional view of a photomask according to this other embodiment.

Referring to FIG. 3, in a photomask 3 according to this embodiment, the mask patterns 25a and 25b may include a plurality of films unlike the photomask 1 according to the embodiment illustrated in FIG. 1. The mask patterns 25a and 25b may include first films 26b and 26d, second films 26a and 26c, a capping film pattern 28, an absorption film pattern 29, or the like.

The mask patterns 25a and 25b may include the first films 26b and 26d including a first material and the second films 26a and 26c including a second material. The first material and the second material may be different from each other. For example, the first material may be Mo or Ru and the second material may be Si.

The first films 26b and 26d and the second films 26a and 26c may be alternately laminated. For example, the first films 26b and 26d and the second films 26a and 26c may be laminated with approximately 30 to 60 layers.

After the first films 26b and 26d and the second films 26a and 26c are laminated, the capping film pattern 28 and the absorption film pattern 29 may be sequentially formed. The capping film pattern 28 may serve to protect the first films 26b and 26d and the second films 26a and 26c and to help the absorption film pattern 29 to be easily bonded. The capping film pattern 28 may be made of, for example, silicon oxide, aluminum oxide, chromium oxide, or chromium nitride.

The absorption film pattern 29 may be formed on the capping film pattern 28 and may serve to prevent the exposed light from being reflected. The absorption film pattern 29 may be made of, for example, tantalum nitride, or the like.

A photomask according to another embodiment will be described with reference to FIG. 4. A description of content duplicative with the content described above is not repeated, and a difference will be primarily described.

Figure 4:
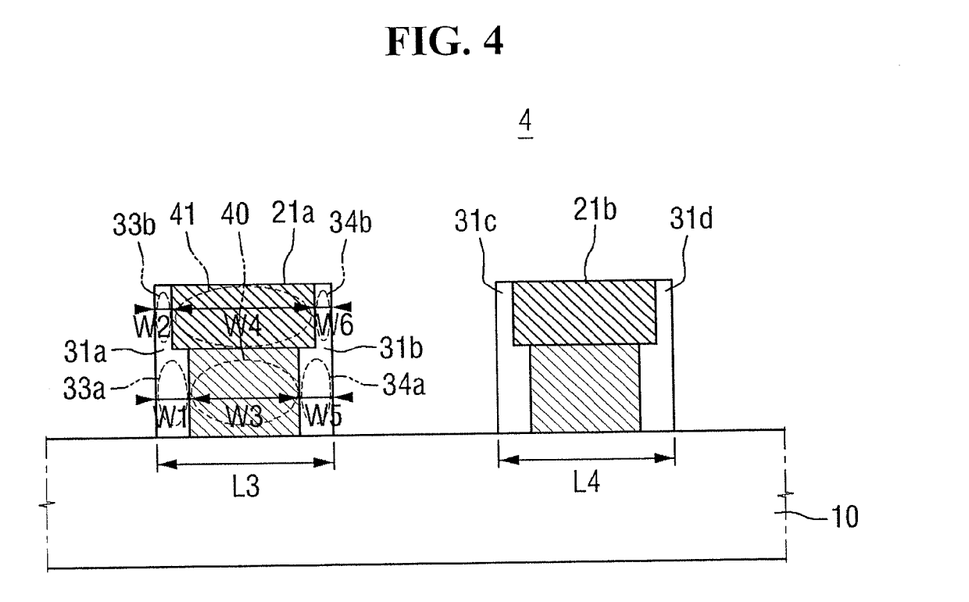
FIG. 4 illustrates a cross-sectional view of a photomask according to another embodiment.

FIG. 4 illustrates a cross-sectional view of a photomask according to this other embodiment.

Referring to FIG. 4, in a photomask 4 according to this embodiment, the shapes of the mask patterns 21a and 21b and the protective layer patterns 31a, 31b, 31c, and 31d may be different from those of the photomask 1 according to the embodiment illustrated in FIG. 1. In detail, the first mask pattern 21a may include a third area 40 and a fourth area 41. The third area 40 may be disposed closer to the transparent substrate 10 than the fourth area 41. A width W3 of the third area 41 may be different from a width W4 of the fourth area 41. The width W3 of the third area 41 may be smaller than the width W4 of the fourth area 41 in FIG. 4.

The mask patterns 21 and 21b may include Mo, Si, O, N, or the like as described above. However, when the mask patterns 21a and 21b are formed, contents of the materials may be different from each other in the third area 40 and the fourth area 41. A difference in an etching amount may occur while forming the mask patterns 21a and 21b due to the difference in content of the material. As a result, the width W3 of the third area 40 may be smaller than the width W4 of the fourth area 41.

The protective layer patterns 31a, 31b, 31c, and 31d may be formed on both side walls of the mask patterns 21a and 21b. In detail, a first protective layer pattern 31a may be formed on one side wall of the first mask pattern 21a and a second protective layer pattern 31b may be formed on the other side wall of the first mask pattern 21a. The first and second protective layer patterns 31a and 31b may include first areas 33a and 34a and second areas 33b and 34b, respectively. The first areas 33a and 34a may be disposed closer to the transparent substrate 10 than the second areas 33b and 34b. Widths W1 and W5 of the first areas 33a and 34a may be larger than widths W2 and W6 of the second areas 33b and 34b. The reason is that a width W3 of the third area 40 is smaller than a width W4 of the fourth area 41, and as a result, a part where the third area 40 is not disposed is formed below the fourth area 41 and the part which the third area 40 is not disposed is filled with the first areas 33a and 34a.

Even though upper and lower widths of the first and second protective layer patterns 31a and 31b and the first mask pattern 21a are different from each other, overall widths thereof may be the same as each other. In detail, the sum of the widths W1 and W5 of the first areas 33a and 34a and the width W3 of the third area 21a may be the same as the sum of the widths W2 and W6 of the second areas 33b and 34b and the width W4 of the fourth area 41. Therefore, an overall width L3 of the first mask pattern 21a and the first and second protective layer patterns 31a and 31b formed on both side walls of the first mask pattern 21a may be continuously uniform. An overall width L4 of the second mask pattern 21b and the third and fourth protective layer patterns 31c and 31d formed on both side walls of the second mask pattern 21b may also continuously uniform. Herein, L3 may be the same as L1 of FIG. 1, and L4 may be the same as L2 of FIG. 1.

The shape of the mask patterns 21a and 21b and the protective layer patterns 31a, 31b, 31c, and 31d illustrated in FIG. 4 may be expressed differently, as explained below. The first and second protective layer patterns 31a and 31b may include a first surface contacting the first mask pattern 21a and a second surface exposed to the outside. The shape of the first surface may depend on the shape of the first mask pattern 21a, but the second surface may be substantially vertical to the transparent substrate 10. Herein, the statement that "the second surface is substantially vertical to the transparent substrate 10" may include implementations in which an angle between the second surface and the transparent substrate is in a range of between about 80° and about 100°, in addition to an implementation where the angle is 90°.

A photomask according to another embodiment will be described with reference to FIG. 5. A description of a content that is duplicative of the content described above is not repeated, and a difference will be primarily described.

Figure 5:
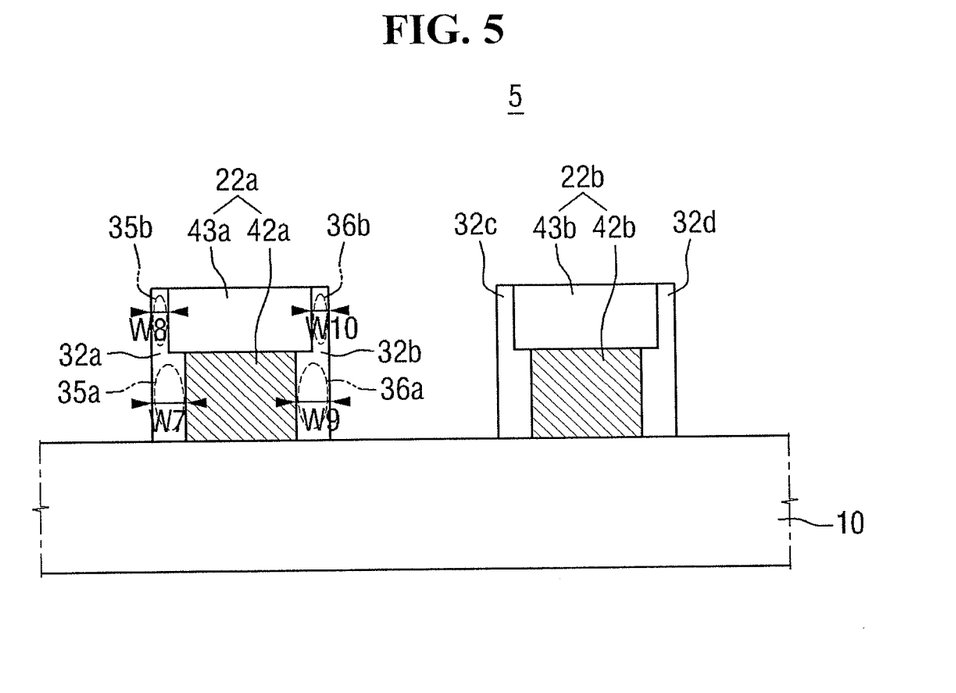
FIG. 5 illustrates a cross-sectional view of a photomask according to another embodiment.

FIG. 5 illustrates a cross-sectional view of a photomask according to this other embodiment.

Referring to FIG. 5, a photomask 5 according to this embodiment is different from the photomask 2 according to the second embodiment with regard to the shapes of mask patterns 22a and 22b.

The mask patterns 22a and 22b may include a light blocking film patterns 42a and 42b and anti-reflection film patterns 43a and 43b. The light blocking film patterns 24b and 24d and the anti-reflection film patterns 24a and 24c are shown to have the same width in FIG. 2. However, in the embodiment illustrated in FIG. 5, the light blocking film patterns 24b and 24d and the anti-reflection film patterns 24a and 24c have different widths. Widths of the light blocking film patterns 42a and 42b may be smaller than widths of the anti-reflection film patterns 43a and 43b. Materials included in the light blocking film patterns 42a and 42b and the anti-reflection film patterns 43a and 43b may be different from each other, and the widths of both patterns may be different from each other.

The widths of the light blocking film patterns 42a and 42b and the widths of the anti-reflection film patterns 43a and 43b may be different from each other. Accordingly, the shapes of protective layer patterns 32a, 32b, 32c, and 32d formed on both side walls of the light blocking film patterns 42a and 42b and the anti-reflection film patterns 43a and 43b may also be different from those of the photomask 2 in FIG. 2. First and second protective layer patterns 32a and 32b may include fifth areas 35a and 36a and sixth areas 35b and 36b. The fifth areas 35a and 36a may be closer to the transparent substrate 10 than the sixth areas 35b and 36b. The fifth areas 35a and 36a may fill a part where the first light blocking film pattern 42a is not disposed below the first anti-reflection film pattern 43a. Therefore, widths W7 and W9 of the fifth areas 35a and 36a may be larger than widths W8 and W10 of the sixth areas 35b and 36b.

A value acquired by adding the widths W8 and W10 of the sixth areas 35b and 36b and the width of the first anti-reflection film pattern 43a may be the same as a value acquired by adding the widths W7 and W9 of the fifth areas 35a and 36a and the width of the first light blocking film pattern 42a. Therefore, the first and second protective layer patterns 32a and 32b, the first anti-reflection film pattern 43a, and the first light blocking film pattern 42a may have a rectangular shape overall. The side walls of the first and second protective layer patterns 32a and 32b that do not contact the first anti-reflection film pattern 43a and the first light blocking film pattern 42a and are exposed to the outside may be substantially vertical to the transparent substrate 10.

A method of manufacturing the photomask according to an embodiment will be described with reference to FIG. 1 and FIGS. 6 through 9. A description of content duplicative of the content described above will not be repeated.

Figure 6:
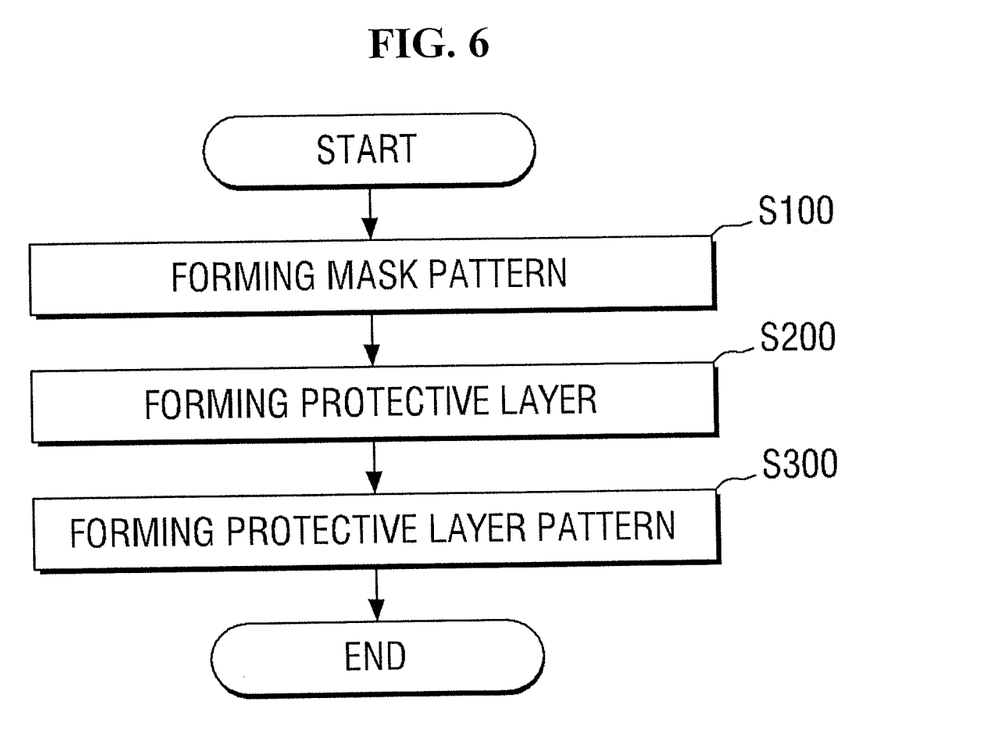
FIG. 6 illustrates a flowchart of a method of manufacturing the photomask according to an embodiment.
Figure 7:
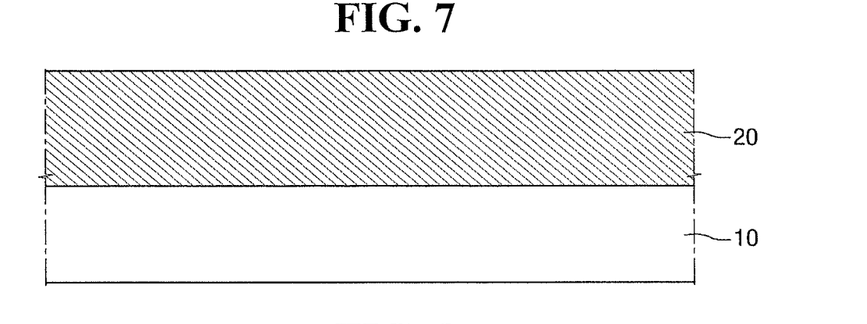
FIGS. 7 through 9 illustrate intermediate-stage diagrams of stages of the method disclosed FIG. 6.
Figure 8:
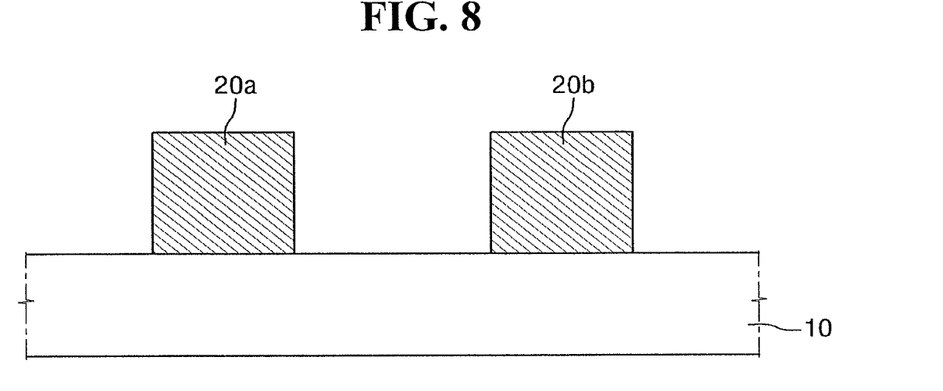
Figure 9:
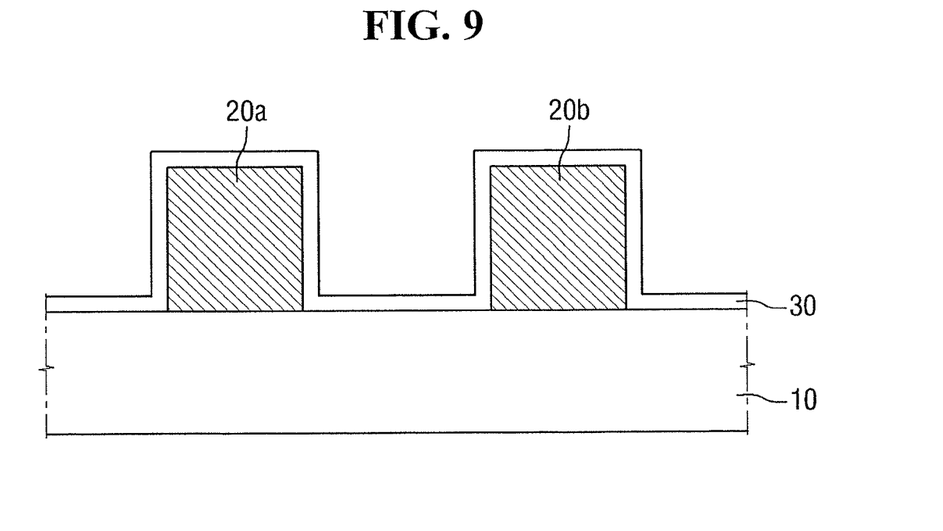

FIG. 6 illustrates a flowchart of a method of manufacturing the photomask according to the first embodiment and FIGS. 7 through 9 illustrate intermediate-stage diagrams of stages of the method of FIG. 6.

First, the mask patterns 20a and 20b may be formed on the transparent substrate 10 (S100). Referring to FIG. 7, a mask 20 may be formed on the transparent substrate 10. A quartz or glass substrate may be used as the transparent substrate 10, as described above. The mask 20 may be formed by using, for example, physical vapor deposition (PVD), sputtering, or atomic layer deposition (ALD). The mask 20 may include, for example, a metallic material such as Mo, or the like and may additionally include Si, O, or N. In other implementations, the mask 20 may include Cr, chromium oxide, or the like.

Referring to FIG. 8, the mask patterns 20a and 20b may be formed by patterning the mask 20.

In order to form the mask patterns 20a and 20b, for example, a photoresist pattern (not illustrated) may be formed on the mask 20 and the mask 20 may be partially removed by using the photoresist pattern as an etching mask. A dry etching or wet etching process may be performed in order to partially remove the mask 20.

Referring to FIG. 9, a protective layer 30 may be formed on the side walls of the mask patterns 20a and 20b (S200). The protective layer 30 may be conformally formed on the top of the transparent substrate 10, the side walls of the mask pattern 20a and 20b, and the tops of the mask patterns 20a and 20b. The protective layer 30 may be formed through the ALD process. When the protective layer 30 is formed by the ALD, the protective layer 30 may be formed of a material different from the mask patterns 20a and 20b, and the protective layer 30 may be easily formed to a desired thickness.

Subsequently, the protective layer patterns 30a, 30b, 30c, and 30d may be formed on the side walls of the mask patterns 20a and 20b like the photomask 1 of FIG. 1 by patterning the protective layer 30 (S300). The protective layer 30 formed on the tops of the mask patterns 20a and 20b and the top of the transparent substrate 10 may be removed so that the protective layer patterns 30a, 30b, 30c, and 30d are formed on only the side walls of the mask patterns 20a and 20b. The protective layer patterns 30a, 30b, 30c, and 30d may fully cover the side walls of the mask patterns 20a and 20b such that the side walls of the mask patterns 20a and 20b are not exposed. The tops of the protective layer patterns 30a, 30b, 30c, and 30d may be exposed.

An anisotropic etching process may be performed in order to pattern the protective layer 30. For example, the patterning may be performed through the dry etching process.

The side walls of the mask patterns 20a and 20b could be oxidized or nitrified in order to form the protective layer patterns 30a, 30b, 30c, and 30d. However, in such a case there is a risk that the protective layer patterns 30a, 30b, 30c, and 30d may not be formed accurately with a desired thickness through oxidization or nitrification.

The protective layer patterns 30a, 30b, 30c, and 30d may be formed to prevent the side walls of the mask patterns 20a and 20b from being etched during the photomask reproduction process. It is desirable that the protective layer patterns 30a, 30b, 30c, and 30d not be etched by the strip solution used during the reproduction process. Accordingly, the etching rate of the protective layer patterns 30a, 30b, 30c, and 30d may be lower than the etching rate of the mask patterns 20a and 20b with respect to $H_2SO_4$ and/or $NH_4OH$ used for the strip solution. The material included in the protective layer patterns 30a, 30b, 30c, and 30d has been described above. Therefore, a description thereof will not be repeated.

A method of manufacturing the photomask according to another embodiment will be described with reference to FIGS. 4, 7, 10, and 11. A description of content that is duplicative of the content described above will not be repeated.

Figure 10:
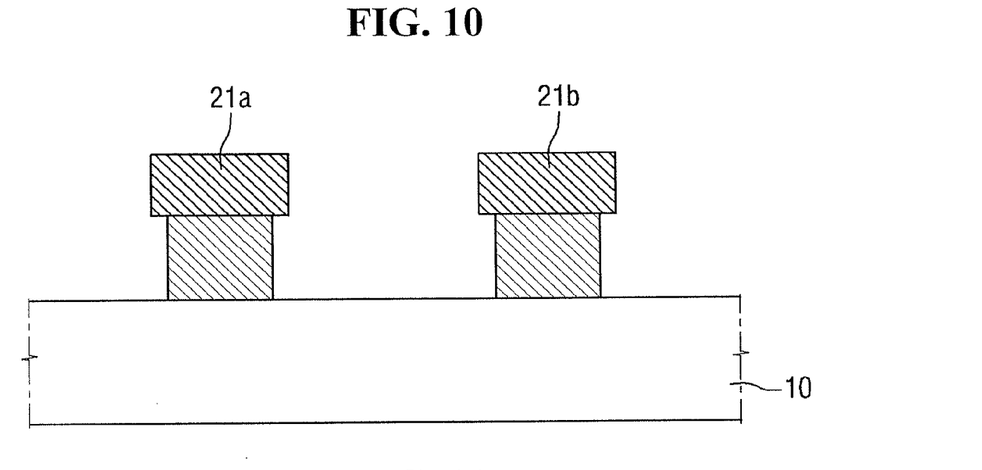
FIGS. 10 and 11 illustrate intermediate-stage diagrams of the method of manufacturing the photomask according to another embodiment.
Figure 11:
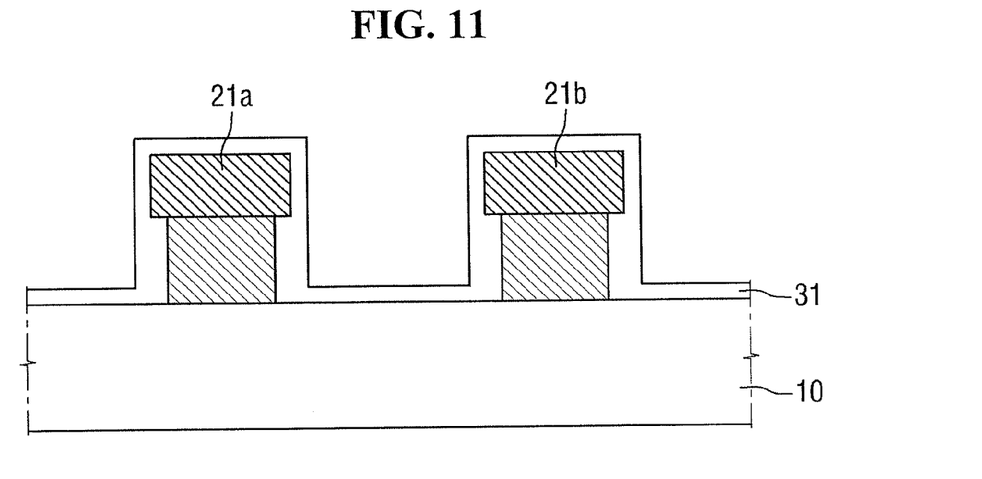

FIGS. 10 and 11 illustrate intermediate-stage diagrams of stages of the method of manufacturing the photomask according to this embodiment.

In the method of manufacturing the photomask according to this embodiment, the mask 20 is formed on the transparent substrate 10 as illustrated in FIG. 7. In addition, the mask patterns 21a and 21b are formed by patterning the mask 20 as illustrated in FIG. 10. However, the method is different from the method of manufacturing the photomask according to the previous embodiment with respect to the shapes of the mask patterns 21a and 21b. In the method of manufacturing the photomask according to this embodiment, the lower parts of the mask patterns 21a and 21b may be more etched than the upper parts at the time of patterning the mask 20. An etching amount of the lower parts of the mask pattern 21a and 21b may be greater than an etching amount of the upper parts. Accordingly, lower widths of the mask patterns 21a and 21b may be smaller than upper widths of the mask patterns 21a and 21b. Such a difference may be generated because the content of the materials included in the upper parts and the lower parts in the mask patterns 21a and 21b may be different from each other. The etching amounts may be different from each other due to the difference in the material content.

Subsequently, a protective layer 31 may be conformally on the transparent substrate 10, the side walls of the mask patterns 21a and 21b, and the tops of the mask patterns 21a and 21b as illustrated in FIG. 11. The protective layer 31 may be formed through an ALD process instead of through oxidation or nitrification. Therefore, the protective layer 31 may be formed accurately with a desired thickness.

Subsequently, the protective layer 31 formed on the side walls of the mask patterns 21a and 21b may remain, and the protective layer 31 on the remaining parts may be removed through anisotropic etching, for example, through a dry etching process, to form the protective layer patterns 31a, 31b, 31c, and 31d of FIG. 4. The tops of the mask patterns 21a and 21b and the top of the transparent substrate 10 may be partially exposed by the anisotropic etching. The photomask 4 illustrated in FIG. 4 may be obtained by the method of manufacturing the photomask according to this embodiment. Since the shape of the photomask 4 has been described above in detail, a description thereof will not be repeated.

By way of summation and review, a photomask used in an exposure process for manufacturing a semiconductor device may be repeatedly reused through a reproduction process. The reproduction process includes a re-pellicle process of removing a pellicle used to protect the photomask and attaching the pellicle again.

However, a pattern of the photomask may be damaged or a change in line width may be caused due to a solution used to remove the pellicle. In particular, as the degree of integration of a semiconductor device pattern has rapidly increased in recent years, a minute change of the pattern of the photomask may significantly degrade the quality and reliability of the semiconductor device.

Embodiments may provide a photomask having improved product reliability and a method of manufacturing the photomask having improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A photomask, comprising:
    a transparent substrate;
    a mask pattern formed on the substrate, wherein the mask pattern includes a first film including a first material and a second film including a second material different from the first material, the first film being on the substrate and the second film being on the first film; and
    a protective layer pattern covering side walls of the mask pattern, wherein a top of the protective layer pattern and a top of the mask pattern are positioned on a same plane and are exposed.

2. The photomask as claimed in claim 1, wherein:
the protective layer pattern includes a first area and a second area,
the first area is closer to the transparent substrate than the second area, and
a width of the first area is larger than a width of second area, the width of the first area and the width of the second area being measured in a direction parallel to the transparent substrate and perpendicular to a side surface of the mask pattern.

3. The photomask as claimed in claim 2, wherein:
the first film of the mask pattern includes a third area and the second film of the mask pattern has a fourth area,
the first area of the protective layer pattern is on side walls of the third area of the mask pattern and the second area of the protective layer pattern is on side walls of the fourth area of the mask pattern, and
a sum of widths of the first and third areas is the same as a sum of widths of the second and fourth areas.

4. The photomask as claimed in claim 2, wherein:
the protective layer pattern includes a first surface contacting the mask pattern and a second surface exposed to the outside, and
the second surface is substantially vertical to the transparent substrate.

5. The photomask as claimed in claim 1, wherein the mask pattern includes a plurality of films formed by alternately laminating additional films including the first material and additional films including the second material.

6. The photomask as claimed in claim 5, wherein the first material includes at least one of Mo and Ru and the second material includes Si.

7. The photomask as claimed in claim 1, wherein an etching rate of the protective layer pattern to at least one of $H_2SO_4$ and $NH_4OH$ is lower than that of the mask pattern.

8. A photomask, comprising:
a transparent substrate;
a mask pattern formed on the substrate; and
a protective layer pattern covering side walls of the mask pattern,
wherein a top of the protective layer pattern is exposed,
wherein:
the mask pattern includes Mo, and
the protective layer pattern includes at least one of Si, Cr, Ta, Zr, chromium oxide ($CrO_x$), chromium nitride ($CrN_x$), zirconium oxide ($ZrO_x$), tantalum oxide ($TaO_x$), and tantalum nitride ($TaN_x$).

9. The photomask as claimed in claim 1, wherein:
the protective layer pattern being formed by depositing a protective layer on the mask pattern through an atomic layer deposition (ALD) process and patterning the protective layer.

* * * * *